United States Patent [19]
Otsuki

[11] Patent Number: 5,801,435
[45] Date of Patent: Sep. 1, 1998

[54] RESIN SEALING TYPE SEMICONDUCTOR DEVICE AND METHOD OF MAKING THE SAME

[75] Inventor: Tetsuya Otsuki, Nagano-ken, Japan

[73] Assignee: Seiko Epson Corporation, Tokyo, Japan

[21] Appl. No.: 607,139

[22] Filed: Feb. 26, 1996

[30] Foreign Application Priority Data

Feb. 27, 1995 [JP] Japan .................... 7-038776
Nov. 16, 1995 [JP] Japan .................... 7-323847

[51] Int. Cl.⁶ .......... H01L 23/495; H01L 23/28; H01L 23/29
[52] U.S. Cl. .......... 257/675; 257/787; 257/793; 257/796; 257/784
[58] Field of Search .................. 257/712, 675, 257/796, 787, 706, 736, 676, 783, 784, 788, 793

[56] References Cited

U.S. PATENT DOCUMENTS

| | | |
|---|---|---|
| 3,212,569 | 10/1965 | McAdam . |
| 3,290,564 | 12/1966 | Wolff, Jr. . |
| 3,965,277 | 6/1976 | Guditz et al. .............. 430/319 |
| 4,151,543 | 4/1979 | Hayakawa et al. ........ 257/668 |
| 4,684,975 | 8/1987 | Takiar et al. .............. 257/673 |
| 4,903,118 | 2/1990 | Iwada ........................ 257/783 |
| 4,942,497 | 7/1990 | Mine et al. ................ 257/714 |
| 5,050,040 | 9/1991 | Gondusky et al. ....... 257/720 |
| 5,105,259 | 4/1992 | McShane et al. ......... 257/667 |
| 5,157,478 | 10/1992 | Ueda et al. ................ 257/796 |
| 5,172,213 | 12/1992 | Zimmerman ............. 257/790 |
| 5,200,809 | 4/1993 | Kwon ........................ 257/707 |
| 5,202,288 | 4/1993 | Doering et al. ........... 437/209 |
| 5,208,188 | 5/1993 | Newman ................... 257/668 |
| 5,227,662 | 7/1993 | Ohno et al. ............... 257/676 |
| 5,229,643 | 7/1993 | Ohta et al. ................. 257/706 |
| 5,252,855 | 10/1993 | Ogawa et al. ............. 257/676 |
| 5,262,927 | 11/1993 | Chia et al. ................. 257/666 |
| 5,328,870 | 7/1994 | Marrs ........................ 437/216 |
| 5,345,106 | 9/1994 | Doering et al. ........... 257/706 |
| 5,367,196 | 11/1994 | Mahulikar et al. ....... 257/787 |
| 5,381,042 | 1/1995 | Lerner et al. ............. 257/712 |
| 5,438,478 | 8/1995 | Kondo et al. ............. 257/706 |
| 5,444,025 | 8/1995 | Sono et al. ................ 257/796 |
| 5,455,462 | 10/1995 | Marrs ........................ 257/796 |

FOREIGN PATENT DOCUMENTS

| | | |
|---|---|---|
| 0 164 794 A2 | 12/1985 | European Pat. Off. . |
| 0 436 126 A2 | 7/1991 | European Pat. Off. . |
| 0521405 A1 | 6/1992 | European Pat. Off. . |
| 0 693 779 | 1/1996 | European Pat. Off. . |
| A-54-124678 | 9/1979 | Japan . |
| A-56-122134 | 9/1981 | Japan . |
| A-58-12341 | 1/1983 | Japan . |
| A-59-207645 | 11/1984 | Japan . |
| A-61-166051 | 7/1986 | Japan . |
| A-62-97358 | 5/1987 | Japan . |
| A-63-179557 | 7/1988 | Japan . |
| A-63-240053 | 10/1988 | Japan . |
| 6-66351 | 3/1989 | Japan . |
| A-2-307251 | 12/1990 | Japan . |
| A-3-222464 | 10/1991 | Japan . |

(List continued on next page.)

*Primary Examiner*—Mahshid D. Saadat
*Assistant Examiner*—Jhihan B. Clark
*Attorney, Agent, or Firm*—Oliff & Berridge, PLC

[57] ABSTRACT

A resin sealing type semiconductor device includes a semiconductor element having electrodes and a fixing surface, and a heat radiator for cooling the semiconductor element. The heat radiator includes a mounting surface on which the semiconductor element is mounted. A bonding layer is formed on the mounting surface between the semiconductor element and the heat radiator. The planar dimension of the bonding layer is smaller than that of the fixing surface of the semiconductor element. The semiconductor element adheres to the bonding layer through an adhesive layer. A resin package seals the semiconductor element, the heat radiator, and parts of leads and wires.

19 Claims, 5 Drawing Sheets

FOREIGN PATENT DOCUMENTS

| | | | |
|---|---|---|---|
| 3-265161 | 11/1991 | Japan | 257/796 |
| A-3-280453 | 12/1991 | Japan | |
| A-4-10558 | 1/1992 | Japan | |
| A-4-11758 | 1/1992 | Japan | |
| A-4-27145 | 1/1992 | Japan | |
| A-4-91458 | 3/1992 | Japan | |
| A-4-158556 | 6/1992 | Japan | |
| A-4-174551 | 6/1992 | Japan | |
| A-4-199664 | 7/1992 | Japan | |
| A-4-230056 | 8/1992 | Japan | |
| A-4-316357 | 11/1992 | Japan | |
| A-5-211262 | 8/1993 | Japan | |
| 5-308107 | 11/1993 | Japan | |
| 6-053390 | 2/1994 | Japan | |
| A-6-97321 | 4/1994 | Japan | |
| A-6-97326 | 4/1994 | Japan | |
| 6-53390 | 5/1994 | Japan | |
| 6-132444 | 5/1994 | Japan | 257/676 |

RESIN SEALING TYPE SEMICONDUCTOR DEVICE AND METHOD OF MAKING THE SAME

BACKGROUND OF THE INVENTION

1. Field of the Invention

The invention relates to a semiconductor device with a heat radiator and a method of making such a semiconductor device.

2. Description of Related Art

In recent years, with the increase in power consumption of the VLSI and similar devices, the need for low cost improvements to the heat radiating properties of semiconductor devices with has increased. To meet this need, it has been studied whether the thermal conductivity in lead frames or sealing resin should be improved. In terms of the structure, it has been studied whether the heat radiating property should be improved by changing the design of the lead frames or by providing an additional heat sink or heat radiator. Particularly the improvement of the heat radiating property of a package by adding the heat radiator is believed to be the most orthodox countermeasure in LSIs in which the power consumption thereof is substantially equal to two watts per chip.

From the viewpoint of the heat radiation, JP 6-53390 discloses a structure in which a heat radiator having a high thermal conductivity is used in place of a die pad. Such a structure can provide a semiconductor device that is superior in heat radiation.

If a semiconductor element is mounted on a heat radiator after the heat radiator has been plated with silver or the like, the thermal or electrical conductivity between the heat radiator and the semiconductor chip can be improved.

However, the plating materials such as silver or the like are inferior in resin adhesion property. If the semiconductor device is of resin sealing type, therefore, a gap tends to be formed between the heat radiator and the sealing resin due to inferiority of the adhesion therebetween. If moisture is accumulated in such a gap then when the semiconductor device is heated, the moisture may be expanded into vapor to enlarge the gap, resulting in separation of the heat radiator from the semiconductor chip.

SUMMARY OF THE INVENTION

The object of the invention is to provide a resin sealing type semiconductor device which has superior adhesion properties between the heat radiator and the sealing resin and which has superior heat radiating properties, and a method of making such a semiconductor device.

The invention provides a resin sealing type semiconductor device comprising a semiconductor element with an electrode and a fixing surface. The fixing surface is bonded to another member. A heat radiator for cooling the semiconductor element has a mounting surface for mounting the semiconductor element. A bonding layer exists between the fixing surface of the semiconductor element and the mounting surface of the heat radiator and is disposed on the mounting surface. The bonding layer is smaller than fixing surface. An adhesive layer bonds the semiconductor element to the bonding layer. Wires connect leads to the electrodes of the semiconductor element. A resin package seals the semiconductor element, the heat radiator, parts of the leads, and the connecting wires.

Since the planar dimension of the bonding layer formed on the heat radiator is smaller than that of the fixing surface of the semiconductor element, the bonding layer will not extend outwardly from the semiconductor element. Therefore, the resin package can seal the heat radiator without contacting the bonding layer. This provides an improved adhesion property between the resin package and the heat radiator.

With the resin sealing type semiconductor device, it is preferred that the heat radiator is electrically conductive, the fixing surface of the semiconductor element being electrically connected to the mounting surface of the heat radiator.

In other words, the heat radiator preferably has an electrical conductivity in addition to its good thermal conductivity. Electrically conductive materials include various metals such as gold, silver and copper. It is further preferable that the semiconductor element is electrically connected to the heat radiator through the fixing and mounting surfaces of the semiconductor element and heat radiator. Thus, the semiconductor element may be grounded through the heat radiator if the heat radiator is in negative potential, for example.

It is further preferable that the bonding layer interposed between the fixing and mounting surfaces of the semiconductor element and heat radiator have an electrical conductivity higher than the surface of the heat radiator. The electrical conductivity between the fixing and mounting surfaces is thus improved through the bonding layer. For example, the heat radiator may be made of copper while the bonding layer is made of silver.

With the resin sealing type semiconductor device, it is further preferred that an electrically conductive layer is formed in an area other than the bonding layer on the mounting surface, the electrically conductive layer having an electrical conductivity higher than the surface of the heat radiator.

The electrically conductive layer can electrically connect the electrodes of the semiconductor element to the heat radiator or the leads to the heat radiator. Wires can connect the electrodes to the heat radiator, and can connect the leads to the heat radiator. As a result, the flexibility in designing the leads can be improved by electrically connecting the electrodes to the leads through the heat radiator. The materials of the electrically conductive layer include various metals such as gold, silver and copper.

With the resin sealing type semiconductor device, the conductive layer may be disposed continuously around the periphery of the bonding layer or may be formed in a shape of a dot having a diameter equal to that of the connecting wires.

With the conductive layer in the continuous shape around the periphery of the bonding layer, the electrodes of the semiconductor element or leads can easily be connected with the conductive layer by the connecting wires.

With the conductive layer in the shape of a dot, the contact area between the resin package and the conductive layer can be minimized since the size of the conductive layer is the minimum necessary for connecting the connecting wires and the conductive layer. Since the conductive layer has an inferior adhesion property because of the resin package, the separation of the resin package from the conductive layer can be reduced to a minimum by minimizing the contact area between the resin package and the conductive layer.

It is further preferable that the bonding layer has a thermal conductivity higher than the surface of the heat radiator.

Thus, the semiconductor element can effectively be cooled by efficiently conducting the heat from the semiconductor element to the heat radiator.

Particularly, if the resin package seals the heat radiator while leaving part of the heat radiator exposed, the efficiency of heat radiation can be further improved.

The resin sealing type semiconductor device is provided by a method comprising several steps.

A bonding layer, which is smaller than a fixing surface of a semiconductor element, is mounted on a mounting surface of a heat radiator.

The fixing surface of the semiconductor element is bonded to the bonding layer via an adhesive agent.

Leads and electrodes of the semiconductor element are connected using connecting wires.

The semiconductor element, the heat radiator, parts of the leads and the connecting wires are sealed with a resin to form a resin package.

It is preferable that the method of making the resin sealing type semiconductor device further comprise the following steps.

A mask is provided which has a portion for defining a first recess on one surface of the mask and another portion for defining a second recess on the other surface of the mask. The diameter of the first recess is larger than the diameter of the second recess, the diameter of the second recess is similar to the diameter of one of the connecting wires, and the first recess and the second recess form a through hole.

The second recess of the mask is placed on the mounting surface of the heat radiator.

A conductive layer, whose diameter is similar to a diameter of one of the connecting wires, is formed in a shape of a dot through the through hole of the mask on the mounting surface of the heat radiator by means of electro-plating.

The conductive layer and electrodes of the semiconductor element are connected via a first set of connecting wires, and connecting leads and electrodes of the semiconductor element are connected via a second set of connecting wires.

Parts of the leads and the connecting wires are sealed with the resin.

These methods can efficiently produce the semiconductor device of the invention.

Particularly by using the mask in which an aperture is made with a large-diameter recess on one surface thereof and a small-diameter recess on the other surface thereof communicating with each other, the plating material can effectively pass through the aperture. Even if the spot-like conductive layer is relatively small, it can easily be formed on the mounting surface of the heat radiator.

BRIEF DESCRIPTION OF THE DRAWINGS

The invention will be described in detail with reference to the following drawings, in which like reference numerals refer to like elements and wherein.

DETAILED DESCRIPTION OF THE PREFERRED EMBODIMENTS

Figure 1:
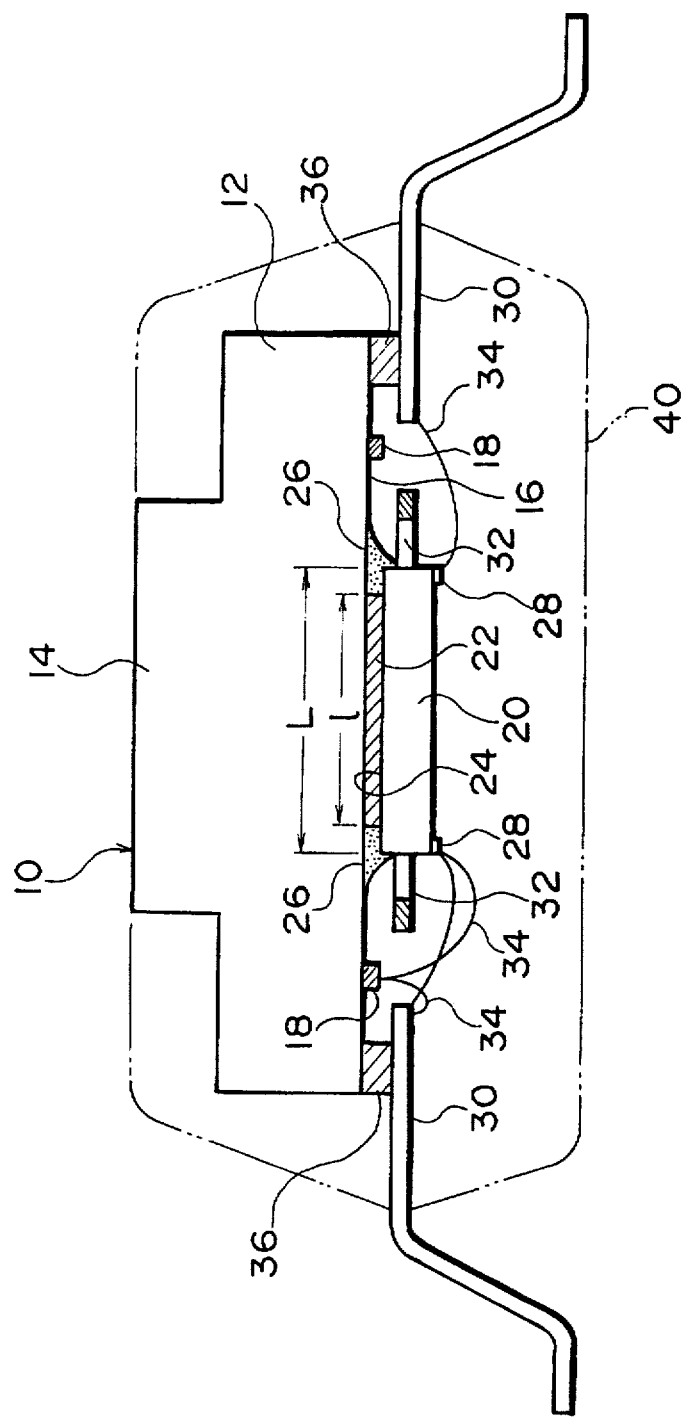
FIG. 1 is a schematic sectional view taken along the line I—I in FIG. 2 showing a semiconductor device of the invention.
Figure 2:
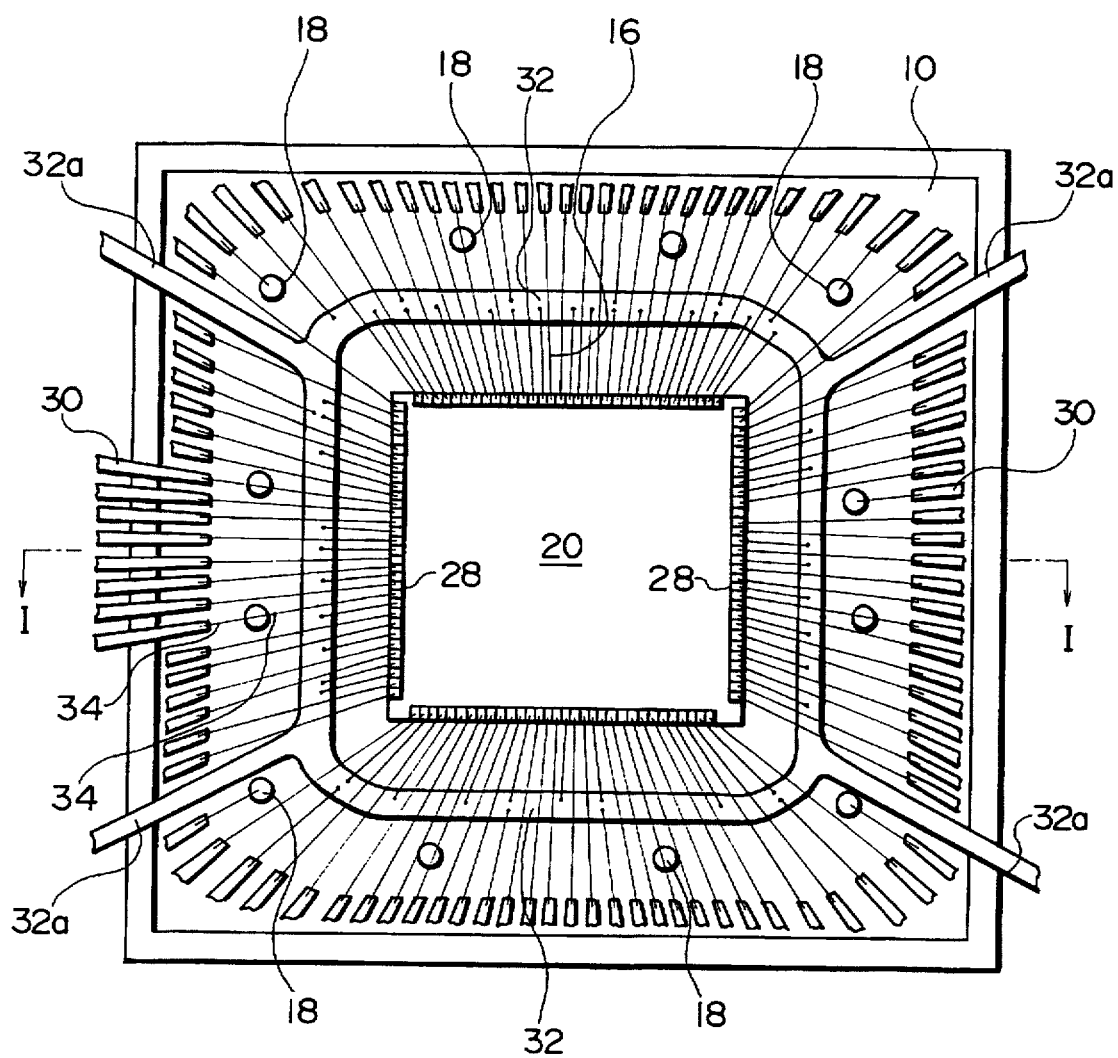
FIG. 2 is a schematic plan view of the semiconductor device of the invention without a resin package.

FIG. 1 is a schematic sectional view taken along the line I—I in FIG. 2 showing a semiconductor device of the invention. FIG. 2 is a schematic plan view of the semiconductor device without a resin package.

The semiconductor device comprises a heat radiator 10, a semiconductor element 20 disposed on the heat radiator 10, a plurality of leads 30 and a frame lead 32 disposed outside of the semiconductor element 20. These components are sealed by a resin package 40.

As shown in FIG. 1, the heat radiator 10 includes a large portion 12 and a small portion 14 protruding from the large portion 12, forming an inverted T-shape in cross-section. The lower surface of the large portion 12 forms a mounting surface 16 on which the semiconductor element 20 is mounted. The upper surface of the small portion 14 forms an exposed area since the resin package 40 does not seal the upper surface. With this structure the heat radiation of the semiconductor device can be improved.

The heat radiator 10 may be formed of epoxy substrates or ceramics preferably formed of thermally conductive material such as copper, silver or gold. These metals are also electrically conductive. In this embodiment copper is used for economical considerations. On the mounting surface 16 of the heat radiator 10 a bonding layer 22 is disposed. The semiconductor element 20 is mounted on the heat radiator 10 through the bonding layer 22. The bonding layer 22 is superior in thermal and electrical conductivity and may be formed of silver, gold or platinum, for example. In this embodiment silver is used for economical considerations. The bonding layer 22 is thin and equal to a few microns in thickness although it is exaggeratedly shown in FIG. 1. The bonding layer 22 may be formed through sputtering or electro-plating. Alternatively, the bonding layer 22 may be in the form of an embedded thin film or a plate with an electrical conductivity.

The semiconductor element 20 has a fixing surface 24 which faces the bonding layer 22 and is electrically connected with the bonding layer 22. When the heat radiator 10 is formed of copper and the bonding layer 22 is formed of silver, the semiconductor element 20 can electrically be connected with the heat radiator 10 via the fixing surface 24 through the bonding layer 22, because these metals are electrically conductive. In addition, the bonding layer 22 formed of silver can effectively maintain the electrical connection since the electrical conductivity of the silver is higher than that of the copper.

When the semiconductor element 20 is electrically connected with the heat radiator 10 in such a manner, the semiconductor element 20 can easily be grounded through the heat radiator 10 if the heat radiator 10 is in negative potential, for example.

As seen from FIG. 1, the length "1" of the bonding layer 22 is smaller than the length "L" of the fixing surface 24 of the semiconductor element 20. Thus, the bonding layer 22 will never extend beyond the periphery of the fixing surface 24.

This arrangement is provided because when the bonding layer 22 is formed through silver plating, the silver is inferior in adhesion to a resin which forms the resin package 40.

If the bonding layer 22 extends outwardly from the periphery of the semiconductor element 20, the extended layer portion cannot effectively adhere to the resin package 40. It may be possible that the resin package 40 is separated from the bonding layer 22. In such a case, it is assumed that the electrical connection between the fixing surface 24 of the semiconductor element 20 and the bonding layer 22 is broken. This means that the electrical connection cannot be assured when the fixing surface 24 of the semiconductor element 20 is to be connected to ground (GND) through the bonding layer 22, for example.

As shown in FIG. 1, therefore, the planar dimension of the bonding layer 22 is formed to be smaller than that of the fixing surface 24 of the semiconductor element 20 so that the bonding layer 22 will never extend beyond the periphery of the fixing surface 24. Thus, the resin package 40 will not contact the bonding layer 22. As a result, the resin sealing can completely be made while the electrical connection between the fixing surface 24 of the semiconductor element 20 and the bonding layer 22 is certainly maintained.

More particularly, the semiconductor element 20 adheres to the heat radiator 10 by an adhesive layer 26 of silver paste. As shown in FIG. 1, the adhesive layer 26 forms a fillet which diverges to have its planar dimension larger than the fixing surface 24 of the semiconductor element 20. If the bonding layer 22 has a shape confined within this fillet, the bonding layer 22 will never contact the resin package 40. When a tolerance of disposing the semiconductor element 20 is taken into account, however, it is preferable that the planar dimension of the bonding layer 22 is smaller than that of the fixing surface 24. For example, the bonding layer 22 preferably has such a shape that the periphery of the bonding layer 22 is located about 0.05 millimeters inwardly of the periphery of the fixing surface 24.

On the mounting surface 16 of the heat radiator 10, a plurality of spot-like conductive layers 18 are formed, spaced away from one another around the semiconductor element 20. The conductive layers 18 are formed of a material which is superior in electrical conductivity, such as silver, gold, or platinum. Particularly from the economical viewpoint, this embodiment uses silver. Although the conductive layers 18 are shown exaggeratedly thick in FIG. 1, they actually are in the form of a thin layer having a thickness equal to a few microns. The conductive layers 18 may be formed through any suitable technique, such as sputtering or electro-plating. Alternatively, the conductive layers 18 may be in the form of an embedded silver stud.

Since the electrical conductivity of the silver forming the conductive layers 18 is higher than that of the copper forming the heat radiator 10, the electrical connection can effectively be maintained by connecting the semiconductor element 20 to the heat radiator 10 through the conductive layers 18, rather than via a direct connection.

The conductive layers 18 are electrically connected to electrodes 28 in the semiconductor element 20 or to leads 30 via connecting wires 34.

On the top surface of the heat radiator 10, an insulation layer (not shown) is formed except on the areas on which the bonding layer 22 and conductive layers 18 are formed. Such an insulation layer may be formed of any suitable material as far as it has a desired insulation property. It is however preferable that the material is a metal oxide film provided by oxidizing the metal forming the heat radiator 10, for example. If the heat radiator 10 is formed of copper, the surface of the heat radiator 10 may be oxidized by the use of a strong alkaline treating liquid to form an insulation layer. With such an insulation layer, the leads 30 and frame lead 32 can be prevented from short-circuiting with the heat radiator 10. If the insulation layer is formed of copper oxide, it is normally of a dark color such as black or brown. Thus, the leads 30 can easily be recognized using image recognition in the wire bonding process. In addition, the adhesion property of the heat radiator 10 to the resin package 40 can be improved to increase the mechanical strength in the resin package.

On the mounting surface 16 of the large portion 12, a continuous support 36 is fixed by adhesive. The support extends along the periphery of the mounting surface 16 and is formed by a tape-like insulation, for example, a thermosetting resin such as polyimide or epoxy resin.

The support 36 has so small a width along the periphery of the heat radiator 10 as to support only parts of the leads 30. The support 36 made of the aforementioned resin material absorbs moisture by nature, but the amount of the absorbed moisture may be reduced to as little as possible by making the support 36 small.

The leads 30 are fixedly adhered to the support 36. The frame lead 32 is disposed between the semiconductor element 20 and the leads 30 but does not contact the leads 30. As shown in FIG. 2, the frame lead 32 includes four support leads 32a extending outwardly that support the frame lead 32 in a stable manner. Each support lead 32a has a part fixed on the support 36.

The frame lead 32 functions as a source voltage (Vcc) lead or a reference voltage (Vss) lead. If the frame lead 32 is used as a Vcc lead, the number of necessary power supply leads can greatly be reduced by connecting the power supply electrodes 28 and leads 30 to the frame lead 32 via the connecting wires 34. Thus, the number of signal leads can be increased. This is advantageous since the design flexibility of wiring configurations between the electrodes 28 of the semiconductor element 20 and the leads 30 can be improved.

With the frame lead 32, a predetermined source voltage or reference voltage can be supplied to any position of the electrodes 28 of the semiconductor element 20. Thus, the operational speed of the semiconductor element 20 can be accelerated because noise sources are reduced.

In this embodiment the frame lead 32 is supported by four support leads 32a. Any number and location of the support leads 32a can be selected so long as the support leads 32a can stably support the frame lead 32. For example, two support leads may be provided at two opposite positions.

A method of making the semiconductor device of the aforementioned embodiment will now be described.

The conductive and bonding layers 18, 22 are first formed by silver plating or the like on the mounting surface 16 of the heat radiator 10. The formed layers 18 and 22 are masked and then immersed in a bath of oxidizing solution (e.g., "Ebonol" (Trademark) available from MELTEX Co. Ltd.) for a few seconds to form an insulation layer (not shown) on the surface thereof. The insulation layer thus formed may have a film thickness of 2 to microns and an electrical resistivity equal to or lower than $10^{13}\Omega\cdot cm$. It has been found that such an insulation layer exhibits improved insulation properties.

Alternatively, the conductive and bonding layers 18, 22 may be formed after the insulation layer has been formed.

The semiconductor element 20 is then adhered to the bonding layer 22 on the heat radiator 10 through the conductive adhesive layer 26 that may be made of silver paste or the like. Thereafter, the heat radiator 10, the support 36, and a frame (not shown) integrating all the leads 30 and the frame lead 32 are positioned over each other and the above components are thermo-compression bonded and fixed together by the use of an adhesive such as epoxy resin. The connecting wires 34 are then bonded in a given pattern by a wire bonding device through the conventional technique.

The resin package 40 is then formed of epoxy or any other resin around the integral frame through the conventional molding process. At this time, the top surface of the small portion 14 of the heat radiator 10 is left exposed outwardly from the resin package 40.

Finally, the integrated leads 30 and frame lead 32 are cut away to complete the semiconductor device.

In the resin sealing type semiconductor device thus produced, the bonding layer 22 has such a configuration that it will never extend outwardly from the fixing surface 24 of the semiconductor element 20. Therefore, the bonding layer 22 will not contact the resin package 40 that is inferior in adhesion to the bonding layer 22. As a result, the semiconductor device of this embodiment will not have a disadvantage due to separation between the resin package 40 and the bonding layer 22.

Figure 3:
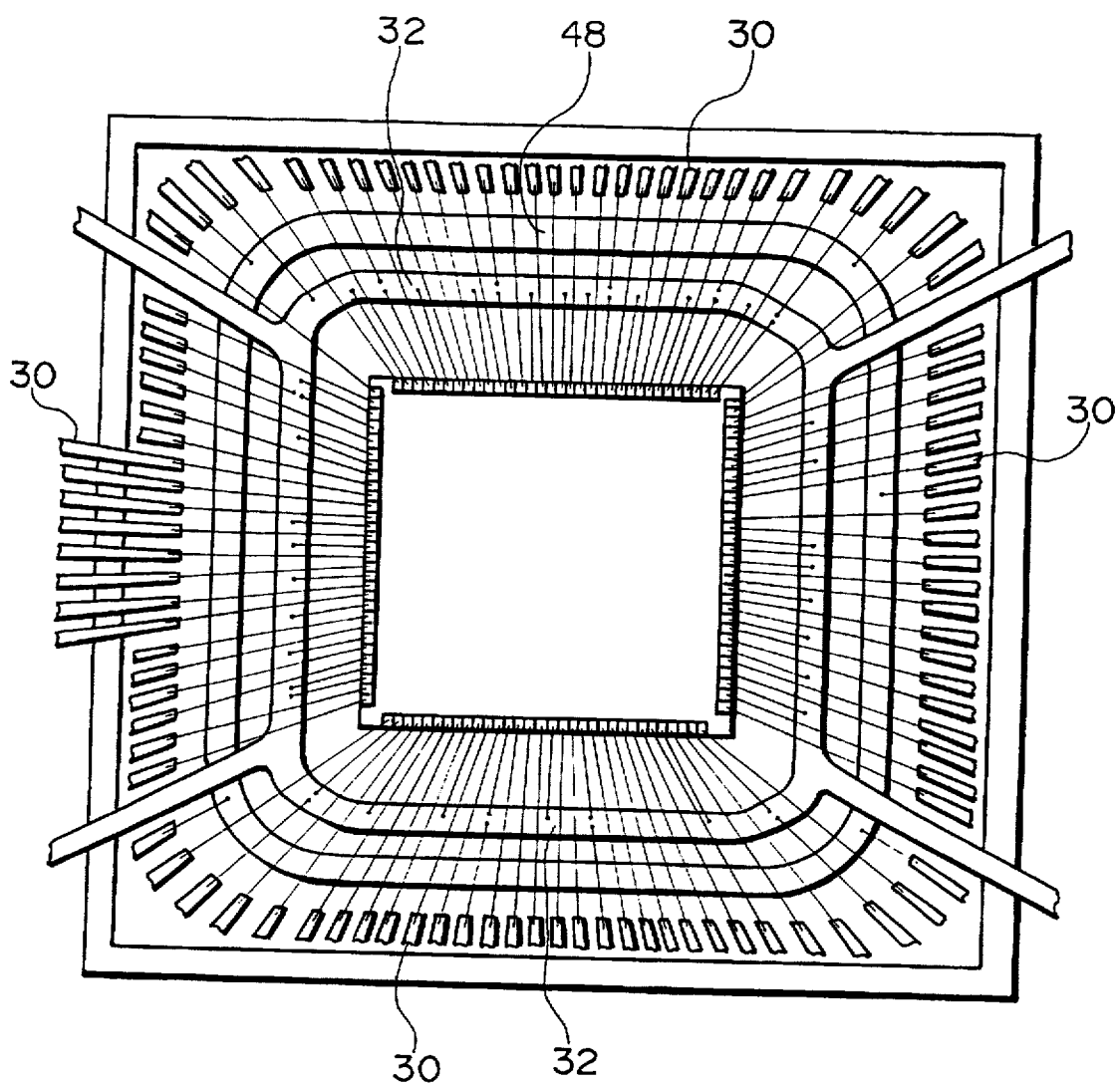
FIG. 3 illustrates another embodiment of the semiconductor device of the invention.

FIG. 3 is a schematic plan view showing the primary parts of another embodiment of a semiconductor device constructed in accordance with the invention. The shape of a conductive layer 48 of this semiconductor device is different from that of the conductive layer 18 shown in FIG. 2. All the other parts are similar to those of the semiconductor device shown in FIG. 2. Therefore, they are denoted by similar reference numerals, but will not further be described.

Referring to FIG. 3, the conductive layer 48 is formed into a rectangular ring between the leads 30 and the frame lead 32, unlike the spot-like conductive layers 18 shown in FIG. 2.

Thus, the conductive layer 48 can more easily be electrically connected at any location than a plurality of conductive layers 18.

Figure 4:
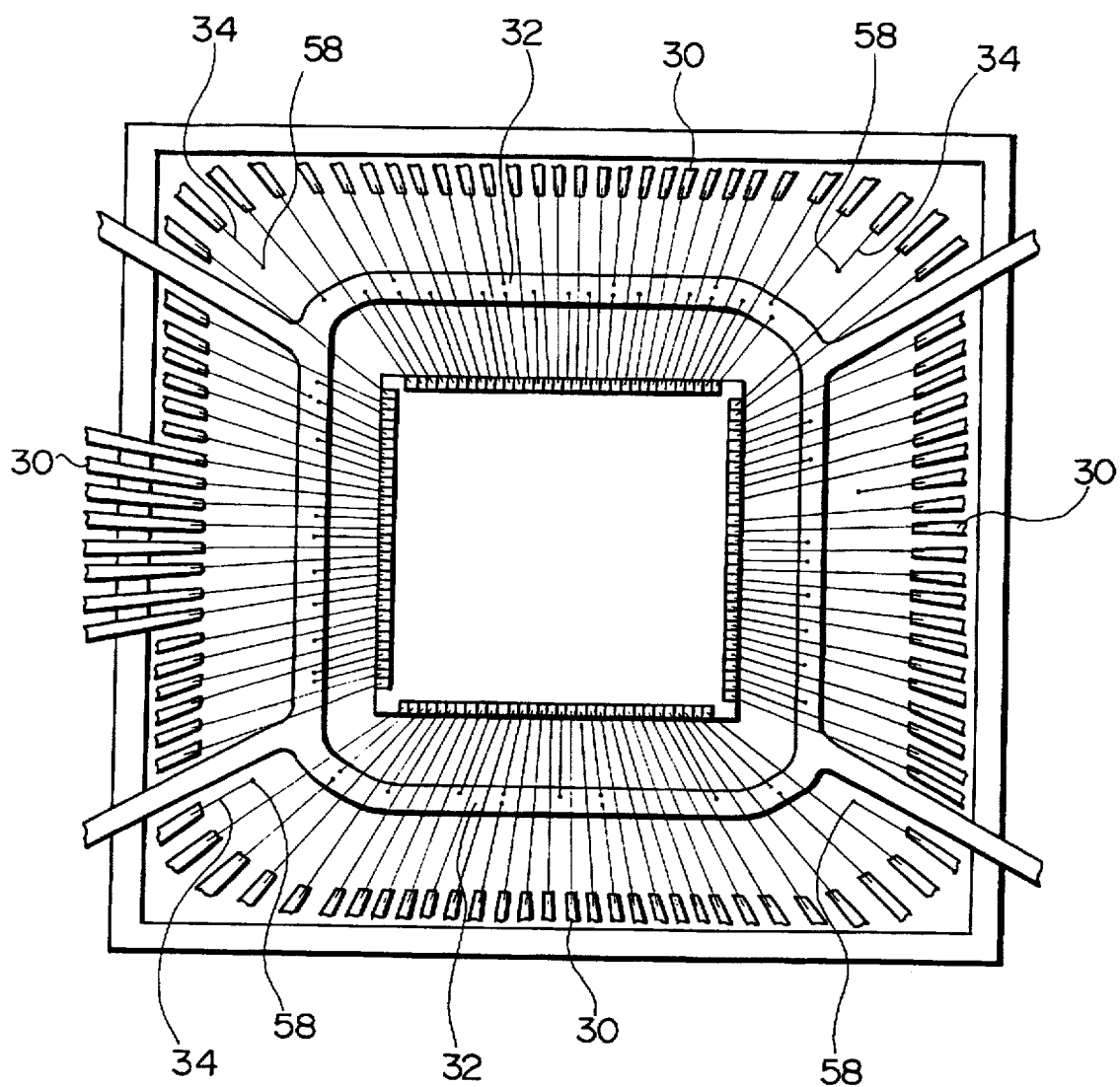
FIG. 4 illustrates still another embodiment of a semiconductor device of the invention.

FIG. 4 is a schematic plan view showing the primary parts of still another embodiment of a semiconductor device constructed in accordance with the invention. The shape of conductive layer 58 of this semiconductor device is different from that of the conductive layer 18 shown in FIG. 2. All the other components are similar to those of the semiconductor device shown in FIG. 2 and designated by similar reference numerals.

Referring to FIG. 4, the conductive layer 58 is formed into a dot having the same diameter as that of the connecting wire 34, unlike the spot-like conductive layers 18 shown in FIG. 2. More particularly, if the diameter of the connecting wire 34 is equal to about 0.8 millimeters, it is preferred that each of the conductive layers 58 has a diameter substantially equal to 0.8 millimeters.

The conductive layers 58 are formed of silver plating material or the like that is inferior in adhesion to the resin package 40. When the conductive layers 58 are formed as small as possible, however, the contact area between the conductive layers 58 and the resin package 40 can be reduced to be as small as possible. Thus, the conductive layers 58 can more effectively be prevented from being separated from the resin package 40.

Figure 5:
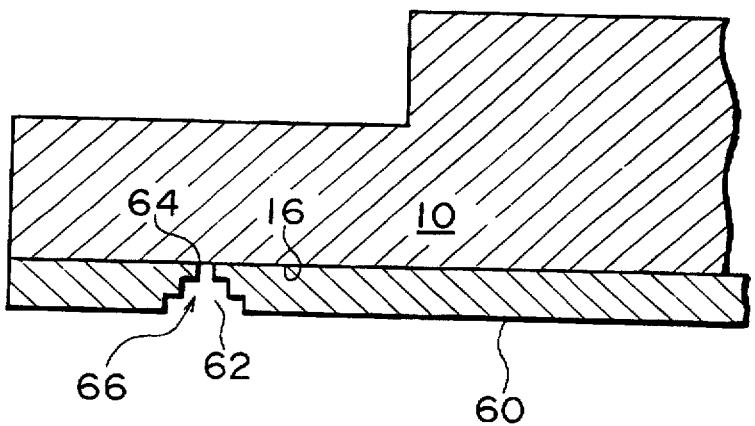
FIG. 5 is a diagram showing a process of making the semiconductor device shown in FIG. 4.

FIG. 5 illustrates a process of forming such extremely small conductive layers 58. Normally, the conductive layers 58 can be formed through an electro-plating method in which the liquid silver is electro-deposited on the semiconductor device through apertures in a mask. If the diameter of the conductive layers 58 is extremely small, however, the diameter of the apertures in the mask is also extremely small. It is difficult to pass the liquid silver through these apertures in the mask. To overcome such a problem, it may be considered that the mask is reduced in thickness. However, the thinner mask tends to be easily fractured.

In this embodiment, therefore, the conductive layers 58 are formed using a mask 60 shown in FIG. 5. The mask 60 includes apertures 66 formed therethrough, each of which has an enlarged-diameter recess 62 formed in the mask 60 on one side and a reduced-diameter recess 64 formed in the mask 60 on the other side, these recesses 62 and 64 communicate with each other. The inner wall of each of the apertures 66 between the enlarged-diameter and reduced-diameter recesses 62, 64 is formed to be a step. Alternatively, the inner wall may be tapered.

The mask 60 is set on the heat radiator 10 with the reduced-diameter recess 64 facing the mounting surface 16 thereof. Liquid silver is then poured onto the mounting surface 16 of the heat radiator 10 from the enlarged-diameter recess 62 through the apertures 66 of the mask 60 to form the dot-like conductive layers 58 having the same diameter as that of the connecting wire 34 through the electro-plating technique.

Since the mask 60 has the enlarged-diameter recess 62 through which the liquid silver is poured into the apertures 66 of the mask, the liquid silver can easily flow through the apertures 66 of the mask 60. In such a case, the thickness of the mask 60 itself can be increased, if necessary.

The process of making all the other components is similar to the process of making the semiconductor devices shown in FIGS. 1 and 2.

While this invention has been described in conjunction with the above outlined specific embodiments thereof, it is evident that many alternatives, modifications and variations will be apparent to those skilled in the art. Accordingly, the preferred embodiments of the inventions as set forth above are intended to be illustrative, not limiting. Various changes may be made without departing from the scope and spirit of the invention.

What is claimed is:

1. A resin sealing type semiconductor device comprising:
    a semiconductor element, said semiconductor element having a plurality of electrodes and a fixing surface for bonding to another member;
    a heat radiator for cooling said semiconductor element, said heat radiator having a mounting surface for mounting said semiconductor element;
    a bonding layer existing between said fixing surface of said semiconductor element and said mounting surface of said heat radiator, said bonding layer being disposed on said mounting surface, and said bonding layer being smaller than said fixing surface wherein said bonding layer has higher thermal conductivity than said heat radiator;,
    an adhesive layer bonding said semiconductor element to said bonding layer the adhesive layer disposed at a periphery of the bonding layer,
    a plurality of leads;
    a plurality of wires, at least one of said wires connecting one of said leads to one of said electrodes of said semiconductor element; and
    a resin package sealing said semiconductor element, said heat radiator, said wires, and parts of said leads.

2. The resin sealing type semiconductor device of claim 1, wherein said resin package seals said heat radiator while exposing a portion of said heat radiator.

3. The resin sealing type semiconductor device of claim 1, wherein said resin package seals said heat radiator while exposing a portion of said heat radiator.

4. A resin sealing time semiconductor device comprising:
    a semiconductor element, said semiconductor element having a plurality of electrodes and a fixing surface for bonding to another member;

a heat radiator for cooling said semiconductor element, said heat radiator having a mounting surface for mounting said semiconductor element;

a bonding layer existing between said fixing surface of said semiconductor element and said mounting surface of said heat radiator, said bonding layer being disposed on said mounting surface, and said bonding layer being smaller than said fixing surface;

an adhesive layer bonding said semiconductor element to said bonding layer, the adhesive layer disposed at a periphery of the bonding layer;

a plurality of leads;

a plurality of wires, at least one of said wires connecting one of said leads to one of said electrodes of said semiconductor element; and a resin Package sealing said semiconductor element, said heat radiator, said wires, and parts of said leads wherein said heat radiator has high electrical conductivity, said fixing surface of said semiconductor element is electrically connected to said mounting surface of said heat radiator and said bonding layer has higher electrical conductivity than said heat radiator.

5. The resin sealing type semiconductor device of claim 4, wherein said resin package seals said heat radiator while exposing a portion of said heat radiator.

6. The resin sealing type semiconductor device of claim 4, wherein said bonding layer has higher thermal conductivity than said heat radiator.

7. The resin sealing type semiconductor of claim 4, further comprising a conductive layer, wherein said conductive layer has higher electrical conductivity than said heat radiator, and said conductive layer is disposed on said mounting surface of said heat radiator and separated from said bonding layer.

8. The resin sealing type semiconductor device of claim 6, wherein said resin package seals said heat radiator while exposing a portion of said heat radiator.

9. The resin sealing type semiconductor device of claim 7, wherein said resin package seals said heat radiator while exposing a portion of said heat radiator.

10. The resin sealing type semiconductor device of claim 7, wherein said conductive layer is disposed continuously around a periphery of said bonding layer.

11. The resin sealing type semiconductor device of claim 7, wherein said conductive layer is formed in a shape of a dot, and a diameter of said dot is similar to a diameter of one of said wires.

12. The resin sealing type semiconductor device of claim 7, wherein said bonding layer has higher thermal conductivity than said heat radiator.

13. The resin sealing type semiconductor device of claim 10, wherein said bonding layer has higher thermal conductivity than said heat radiator.

14. The resin sealing type semiconductor device of claim 10, wherein said resin package seals said heat radiator while exposing a portion of said heat radiator.

15. The resin sealing type semiconductor device of claim 13, wherein said resin package seals said heat radiator while exposing a portion of said heat radiator.

16. The resin sealing type semiconductor device of claim 11, wherein said bonding layer has higher thermal conductivity than said heat radiator.

17. The resin sealing type semiconductor device of claim 11, wherein said resin package seals said heat radiator while exposing a portion of said heat radiator.

18. The resin sealing type semiconductor device of claim 16, wherein said resin package seals said heat radiator while exposing a portion of said heat radiator.

19. The resin sealing type semiconductor device of claim 12, wherein said resin package seals said heat radiator while exposing a portion of said heat radiator.

* * * * *